(12) United States Patent
Kikuchi et al.

(10) Patent No.: US 7,012,243 B2
(45) Date of Patent: Mar. 14, 2006

(54) PHOTO-SENSOR AND METHOD FOR MANUFACTURING THE PHOTO-SENSOR

(75) Inventors: Satoru Kikuchi, Yamanashi-ken (JP); Koichi Fukasawa, Yamanashi-ken (JP)

(73) Assignee: Citizen Electronics Co., Ltd., Yamanashi-ken (JP)

(*) Notice: Subject to any disclaimer, the term of this patent is extended or adjusted under 35 U.S.C. 154(b) by 8 days.

(21) Appl. No.: 10/801,528

(22) Filed: Mar. 17, 2004

(65) Prior Publication Data

US 2004/0182994 A1    Sep. 23, 2004

(30) Foreign Application Priority Data

Mar. 17, 2003   (JP)   ............................. 2003-072739

(51) Int. Cl.
*H01J 40/14*     (2006.01)
(52) U.S. Cl. ..................... 250/226; 257/432; 438/70

(58) Field of Classification Search ............. 250/208.1, 250/239, 216, 226; 257/431, 432, 433, 439; 438/64–66, 70
See application file for complete search history.

(56) References Cited

U.S. PATENT DOCUMENTS 4,523,102 A * 6/1985 Kazufumi et al. ....... 250/208.1
4,827,117 A * 5/1989 Uchida et al. ........... 250/214.1

* cited by examiner

*Primary Examiner*—Kevin Pyo
(74) *Attorney, Agent, or Firm*—Dennison, Schultz, Dougherty & MacDonald

(57) ABSTRACT

A photo-sensor has a light-sensitive element mounted on a substrate, the light-sensitive element is encapsulated by an encapsulation resin. A filter layer is mounted on the encapsulation resin. The filter layer has a filtering effect corresponding to spectral responsivity of the light-sensitive element.

4 Claims, 3 Drawing Sheets

PHOTO-SENSOR AND METHOD FOR MANUFACTURING THE PHOTO-SENSOR

BACKGROUND OF THE INVENTION

The present invention relates to a photo-sensor used in a portable equipment such as a portable telephone, remote controller and others, and to a method for manufacturing the photo-sensor.

The remote controller is used for controlling the operation of an electronic equipment such as an audio-visual equipment and a communication equipment, by using infrared rays and visible rays. On the other hand, the equipment controlled by the signal rays from the remote controller is provided with a photo-sensor having a light-sensitive element such as a photodiode or a phototransistor for detecting the control signal.

The conventional photo-sensor can not detect signal rays which is not sensed by the spectral responsivity of the light-sensitive element mounted on the photo-sensor.

Japanese Patent Application Laid Open 08-204653 discloses a photo-sensor. The light-sensitive element provided in the photo-sensor is coated with an epoxy resin mixed with a visible light protective agent so that a condenser lens is formed on the photo-detector constructed with an engineering plastic containing an infrared ray protective agent as an optical band pass filter.

Japanese Patent Application Laid Open 10-223039 discloses another photo-sensor provided with a light-sensitive element. The photo-sensor has a band pass filter with an interference film having a transmission central wavelength approximately coincident with a central wavelength of signal rays from a remote controller.

FIG. 4 is a graph showing a spectral responsivity of a conventional photo-sensor. In the graph, the reference a shows an inherent spectral responsivity of the light-sensitive element, and the reference b shows a spectral responsivity of a photo-sensor having a band pass filter.

However, in a visible ray sensor, particularly a luminous efficiency sensor, a light-sensitive element which is a band pass filter element having a luminous efficiency had to be used. In order to provide a band pass function in the light-sensitive element to be used, a dielectric multilayer or a metal multilayer is formed on a light receiving portion by evaporation.

Another method is to form an absorption layer on the light-sensitive element or to add an impurity to the light-sensitive element, thereby controlling the band to improve the epitaxy construction.

These methods increase the manufacturing cost. Furthermore, it is difficult to control the filtering effect of the light-sensitive element, and hence there is limit to improve the band pass filtering effect. If an outside filter is used, the photo-sensor is increased in size and the manufacturing cost rises.

SUMMARY OF THE INVENTION

An object of the present invention is to provide a photo-sensor and a method for manufacturing the photo sensor which may detect signal rays from a remote controller without limitation of the spectral responsivity of a light-sensitive element provided therein.

According to the present invention, there is provided a photo-sensor for detecting signal rays comprising a substrate, a light-sensitive element mounted on the substrate, an encapsulation resin encapsulating the light-sensitive element, a filter layer mounted on at least a surface of encapsulation resin, characterized in that the filter layer has a filtering effect corresponding to spectral responsivity of the light-sensitive element.

The filter layer comprises a metal multilayer filter.

In another aspect of the present invention, the filter layer comprises a dielectric multilayer filter.

The present invention further provides a method for manufacturing a plurality of photo-sensors.

The method comprises the steps of preparing a substrate aggregation having a plurality of divisions, mounting a light-sensitive element on the substrate aggregation at each division, encapsulating the light-sensitive elements by encapsulating resin to form a resin layer, forming a filter layer on the resin layer to form a light-sensitive element aggregation, and dicing the aggregation at boundaries between divisions, thereby producing a plurality of independent photo-sensors.

These and other objects and features of the present invention will become more apparent from the following detailed description with reference to the accompanying drawings.

DETAILED DESCRIPTION OF THE PREFERRED EMBODIMENT

Figure 1:
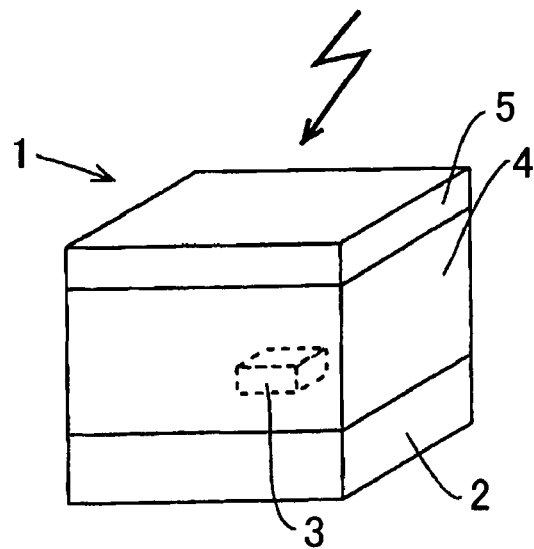
FIG. 1 is a perspective view showing a photo-sensor according to the present invention.
Figure 2:
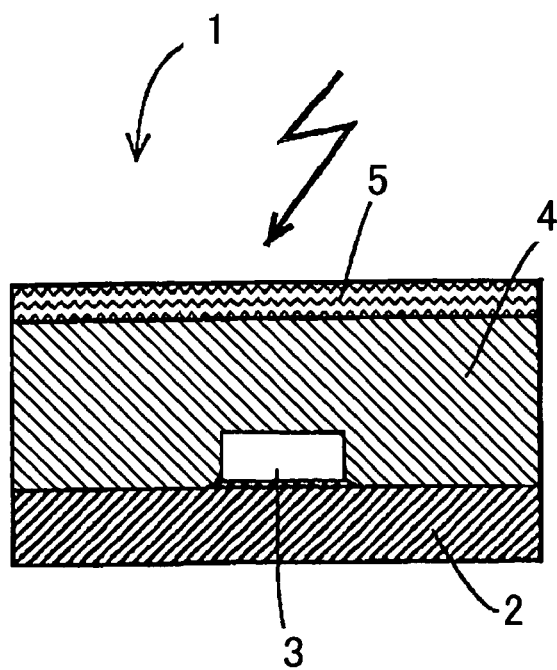
FIG. 2 is a sectional view of the photo-sensor.

Referring to FIGS. 1 and 2, a photo-sensor 1 of the present invention comprises a substrate 2, a light-sensitive element 3 mounted on the substrate 2, an encapsulation resin 4 encapsulating the light-sensitive element 3, and a filter layer 5 mounted on the encapsulation resin 4. Thus, a parallelepiped photo-sensor 1 is formed. On the substrate 2, a wiring pattern and a land pattern (not shown) are formed, which are connected to terminal electrodes provided on the underside of the substrate by through-holes (not shown). The light-sensitive element 3 comprises a photodiode or phototransistor.

The filter layer 5 has a filtering effect for passing signal rays of a wavelength width of the spectral responsivity of the light-sensitive element. In order to coincide the filtering effect to the spectral responsivity of the light-sensitive element, the filter layer 5 comprises a metal multilayer filter or a dielectric multilayer filter. For example, the metal multilayer filter is formed by vacuum deposition or plating or pattern transferring a metal layer of Ag—MgF—Ag. The dielectric multilayer filter comprises a layer such as $TiO_2$—$SiO_2$ except metal materials.

Therefore, the wavelength of incident signal rays is filtered to the wavelength of the spectral responsivity of the light-sensitive element of the photo-sensor by the filter layer 5. Thus, the photo-sensor detects signal rays of various wavelengths.

Hereinafter, a method for manufacturing a plurality of photo-sensors at the same time is described.

Figure 3A:
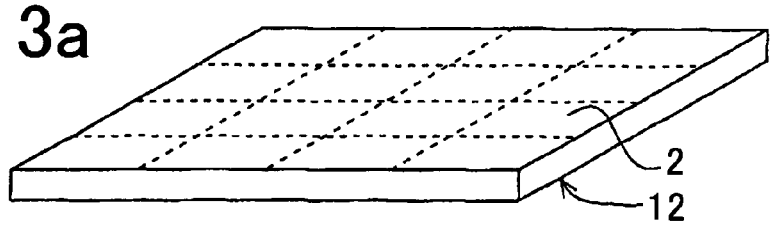
FIGS. 3a to 3e are perspective views showing a method for manufacturing the photo-sensor.

FIG. 3a is a perspective view showing a substrate aggregation 12. The substrate aggregation 12 has a plurality of divisions. Each division is formed for the substrate 2. In each division the wiring pattern and land pattern are formed.

Figure 3B:
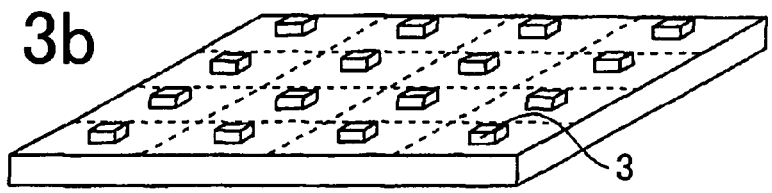

FIG. 3b is a perspective view showing a mounting step of the light-sensitive element 3. The light-sensitive element 3 is mounted on the substrate aggregation 12 at each division.

Figure 3C:
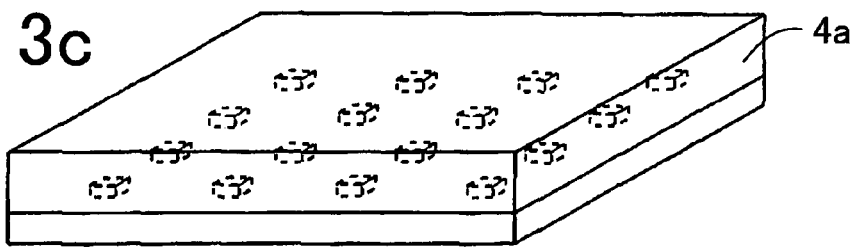

FIG. 3c is a perspective view showing an encapsulation step of a resin. The light-sensitive elements 3 are encapsulated by a resin layer 4a.

Figure 3D:
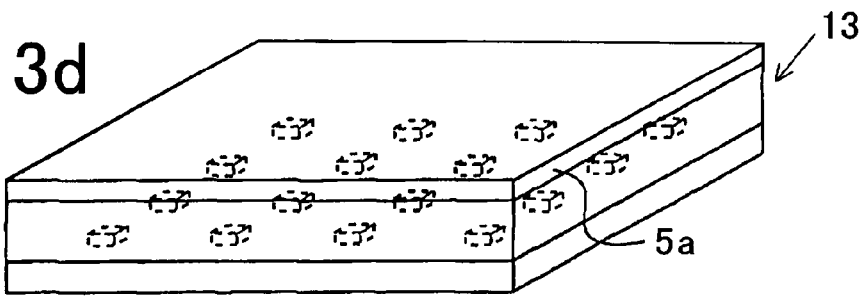

FIG. 3d is a perspective view showing a filter layer forming step. A metal multilayer filter layer 5a of Ag—MgF—Ag is formed by heaping each layer by deposition or plating or pattern transferring.

Thus, a photo-sensor aggregation 13 is formed.

Figure 3E:
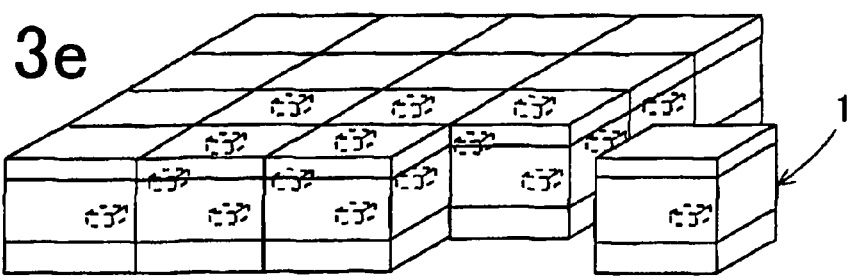
Figure 4:
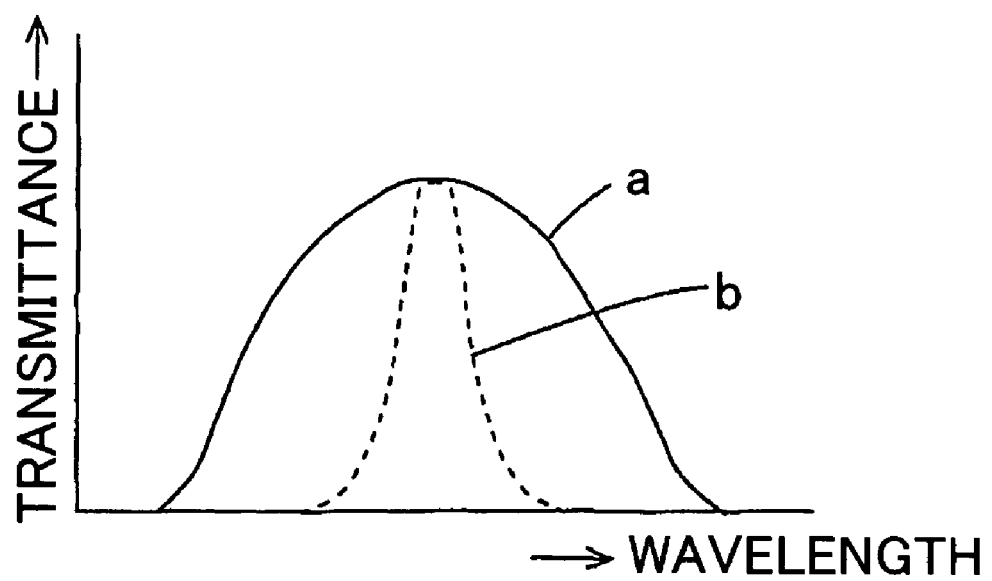
FIG. 4 is a graph showing a spectral responsivity of a conventional photo-sensor.

The photo-sensor aggregation 13 is diced at boundaries between divisions as shown in FIG. 3e so that the single photo-sensor 1 is completed.

Thus, in accordance with the present invention, a large number of photo-sensors can be manufactured at the same time at a low cost.

In accordance with the present invention, since the metal multilayer filter of a low pass filter or high pass filter is formed on the encapsulation resin and passes signal rays having a wavelength corresponding to the spectral responsivity of the light-sensitive element, the photo-sensor detects signal rays without limitation of the wavelength.

While the invention has been described in conjunction with preferred specific embodiment thereof, it will be understood that this description is intended to illustrate and not limit the scope of the invention, which is defined by the following claims.

What is claimed is:

1. A photo-sensor for detecting signal rays comprising:
   a substrate;
   a light-sensitive element mounted on the substrate;
   an encapsulation resin encapsulating the light-sensitive element; and
   a filter layer mounted on at least a surface of the encapsulation resin;
   the filter layer being directly mounted on the surface of the encapsulation resin, and
   the substrate, encapsulation resin and filter layer forming a parallelepiped, each outside surface of the parallelepiped being an continuous, smooth surface.

2. The photo-sensor according to claim 1 wherein the filter layer comprises a metal multilayer filter.

3. The photo-sensor according to claim 1 wherein the filter layer comprises a dielectric multilayer filter.

4. A method for manufacturing a plurality of photo-sensors comprising the steps of:
   preparing a substrate aggregation having a plurality of divisions;
   mounting a light-sensitive element on the substrate aggregation at each division;
   encapsulating the light-sensitive elements by encapsulating resin to form a resin layer;
   forming a filter layer directly on the resin layer to form a photo-sensor aggregation; and
   dicing the aggregation at boundaries between divisions, thereby producing a plurality of independent photo-sensors, wherein the substrate, encapsulation resin and filter layer of an each photo-sensor forming a parallelepiped, each outside surface of the parallelepiped being an continuous, smooth surface is inserted.

\* \* \* \* \*